United States Patent [19]

Myers et al.

[11] Patent Number: 5,666,083

[45] Date of Patent: Sep. 9, 1997

[54] DISCRETE PROGRAMMING METHODOLOGY AND CIRCUIT FOR AN ACTIVE TRANSCONDUCTANCE-C FILTER

[75] Inventors: Brent A. Myers; Scott G. Bardsley, both of Palm Bay, Fla.

[73] Assignee: Harris Corporation, Melbourne, Fla.

[21] Appl. No.: 560,289

[22] Filed: Nov. 17, 1995

[51] Int. Cl.[6] .................. H03K 5/00; H03F 3/45
[52] U.S. Cl. .............. 327/553; 327/552; 327/103; 327/554; 330/258; 330/109
[58] Field of Search ............... 327/551, 552, 327/103, 553, 554, 555, 556, 557, 558, 559, 362, 560; 330/107, 109, 303, 305, 306, 294, 291, 258, 259

[56] References Cited

U.S. PATENT DOCUMENTS

| | | | |
|---|---|---|---|
| 4,177,432 | 12/1979 | Hobrecht | 330/252 |
| 4,761,829 | 8/1988 | Lynk, Jr. et al. | 455/307 |
| 4,977,378 | 12/1990 | Tero | 330/252 |
| 5,001,441 | 3/1991 | Gen-Kuong | 327/553 |
| 5,015,966 | 5/1991 | McIntyre | 330/253 |
| 5,331,218 | 7/1994 | Moody et al. | 327/554 |
| 5,345,190 | 9/1994 | Kaylor | 330/303 |
| 5,491,447 | 2/1996 | Goetschel et al. | 330/305 |

FOREIGN PATENT DOCUMENTS 61-52320  5/1994  Japan .................. 327/552

*Primary Examiner*—Timothy P. Callahan
*Assistant Examiner*—Dinh T. Le

[57] ABSTRACT

A circuit and method for adjusting a cutoff frequency of an active filter, such as a gm-C filter, which has a common mode feedback circuit for providing a bias signal may include plural common base stages having first inputs connected in parallel to a stage of the active filter and second inputs connected in parallel to an output from the common mode feedback circuit, and a capacitor connected to an output from each of the common base stages. The common base stages and their connected capacitors are selectively isolated from the filter output to adjust the cutoff frequency of the filter. The deselected common base stages are also isolated from the common mode feedback circuit and bias generator inputs.

20 Claims, 2 Drawing Sheets

5,666,083

DISCRETE PROGRAMMING METHODOLOGY AND CIRCUIT FOR AN ACTIVE TRANSCONDUCTANCE-C FILTER

BACKGROUND OF THE INVENTION

The present invention is related to active electronic filters, and more particularly to a gm-C filter with an adjustable cutoff frequency.

Active filters, such as a typical (low pass) gm-C filter 10 illustrated in FIG. 1, may include circuitry at output node N for adjusting the cutoff frequency of the filter. In a gm-C filter the cutoff frequency may be adjusted by varying the value of Gm in gm stages 12 of filter 10. However, this may distort the signal and a preferable cutoff frequency adjustment technique is to provide an array of capacitors 14, such as illustrated in FIG. 2, to replace the single capacitor C in FIG. 1. The cutoff frequency may be adjusted by selectively connecting one or more of capacitors 14 in the array, such as by closing switches 16. The switches may be MOS switches and the operation of the switches may be programmed for use in devices such as cordless telephones and wireless speakers.

Even this technique is not without problems. When one of capacitors 14 is selected, the stray capacitance (represented by capacitors 18) of deselected capacitors 14 will unacceptably increase the total capacitance of the capacitor array. That is, C(total)=C(selected capacitors)+stray C(deselected capacitors). The effect is especially noticeable when a small capacitor 14 is selected and stray capacitance from a much larger capacitor is present.

To avoid this problem, it is known to move switches 16 to the connection between node N and capacitors 14, such as illustrated by switches 16' shown in dashed lines in FIG. 2. This removes the problem of the stray capacitance, but causes a new problem. In devices in which the supply voltage is small, there may be insufficient gate drive to completely turn on switches 16', and if the supply voltage is increased there may be resistance added that would cause the filter response to vary from ideal. For example, if switches 16' are MOS devices (located between node N and capacitors 14), the top plate of selected capacitor 14 will be forced to a DC level approximately at mid supply. The resulting bias on the MOS devices would generate an unpredictable (and thus unacceptable) amount of series resistance to the circuit. Even if the supply voltage is increased to assure that the MOS switches are activated, the finite amount of added resistance may cause variations in filter response.

SUMMARY OF THE INVENTION

Accordingly, it is an object of the present invention to provide a novel circuit and method for selectably connecting capacitors to adjust the cutoff frequency of a filter that obviate the problems of the prior art.

To facilitate an understanding of the invention, another feature of filters, such as gm-C filters, is illustrated in FIG. 3. Transconductance stages are frequently implemented in fully differential form, and circuitry is required to stabilize the DC output level to achieve maximum dynamic range, typically at mid-supply. Such circuitry typically includes a common mode feedback (CMFB) network 22 and a common base (or gate) stage 24. The transconductance stage (Gm) generates currents I+ and I− proportional to the input voltages $V_{in}+$ and $V_{in}-$. $V_{out}+$ and $V_{out}-$ are generated as outputs from common base stage 24 are integrated via output capacitors C. The output is fed back to CMFB network 22 which receives a reference voltage and provides a bias signal to common base stage 24 for adjusting the two outputs ($V_{out}+$ and $V_{out}-$) to a mid-supply level set by Vref.

A typical common base stage 24, illustrated in FIG. 4, also receives biases A and B from a bias generator 26, such as a bandgap or other suitable generator. The circuit of FIG. 4 is for a differential signal (as in FIG. 3) and sets the net DC current supplied to capacitors C to zero when in a balanced state.

Accordingly, it is another object of the present invention to provide a novel circuit and method for selectably connecting common base stages and their associated capacitors to adjust the cutoff frequency of a filter.

It is yet another object of the present invention to provide a novel circuit and method in which plural connecting common base stages are connected in parallel to a filter stage output and to a common mode feedback circuit output and in which the outputs from the common base stages are selectively provided across associated capacitors to adjust the cutoff frequency of a filter.

It is still another object of the present invention to provide a novel active filter with a common mode feedback circuit for providing a bias in which plural common base stages are selectively connected to an output from the filter to control a tuning range of the filter.

It is a further object of the present invention to provide a novel filter and method for tuning an active filter that has a common mode feedback circuit for providing a bias in which plural common base stages are selectively connected to an output from the filter, and in which the common base stages connect the bias to a supply rail to thereby isolate the bias from the ones of the common base stages that have not been selectively connected.

It is yet a further object of the present invention to provide a novel filter and method for tuning an active filter that has a bias generator for providing a bias in which plural common base stages are selectively connected to an output from the filter, and in which the common base stages are isolated from the generator bias in the ones of the common base stages that have not been selectively connected.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
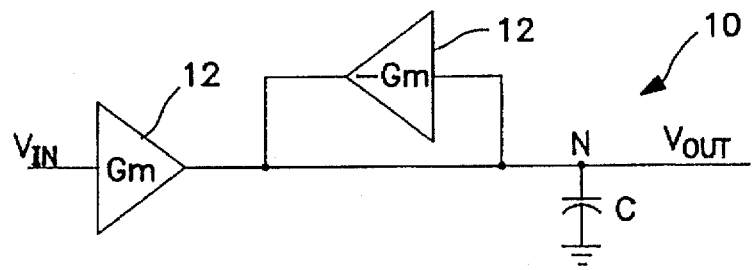
FIG. 1 is a partial circuit diagram of an active (gm-C, low pass) filter of the prior art.
Figure 2:
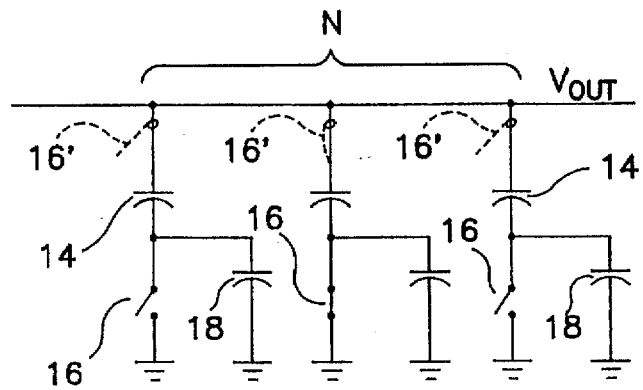
FIG. 2 is a partial circuit diagram of a prior art capacitor array for adjusting a filter's cutoff frequency.
Figure 3:
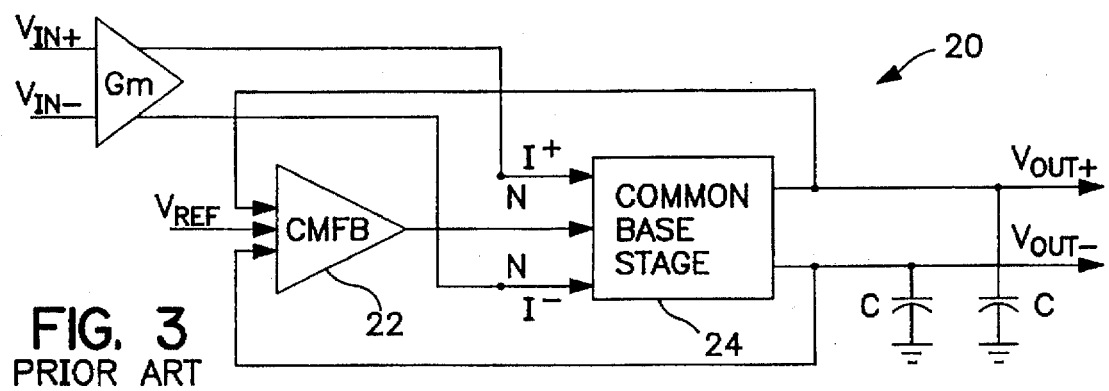
FIG. 3 is a partial block and partial circuit diagram of a prior art output circuit for stabilizing a filter's DC voltage output at a mid-supply point.
Figure 4:
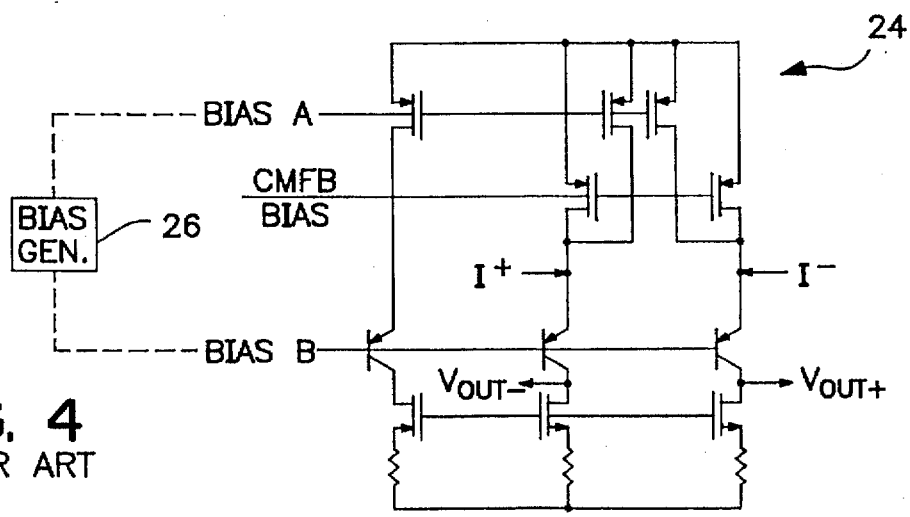
FIG. 4 is a circuit diagram of a prior art common base stage for an active filter.
Figure 5:
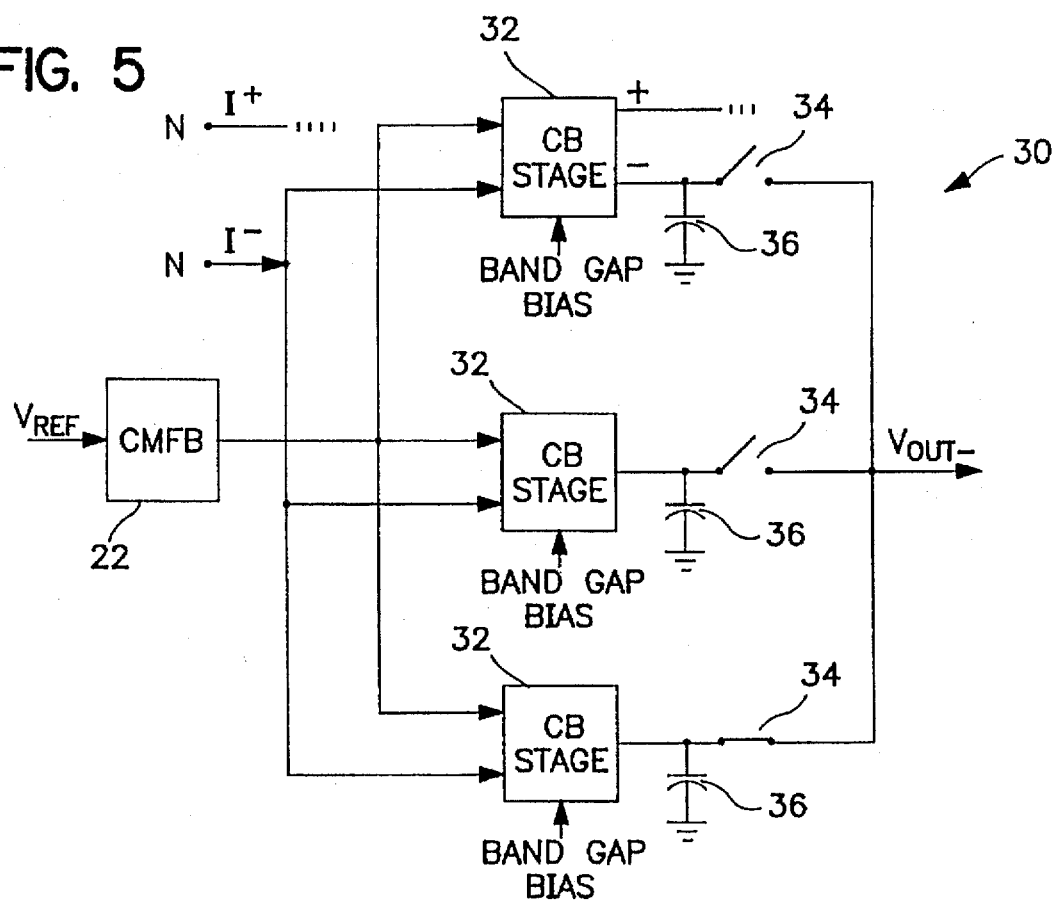
FIG. 5 is a partial block and partial circuit diagram of an embodiment of the present invention.

With reference now to FIG. 5, an embodiment of the present invention may be an output circuit 30 for connection to a node N the output from a gm stage of a gm-C filter (such as illustrated in FIG. 1.) The gm stage receives an input signal and provides an output I− (and output I+ in a differential filter) that may be an interim or final output from the filter. The filter may include a common mode feedback circuit 22 for providing a bias to maintain a DC component of an output voltage at a reference level.

Output circuit 30 may include plural common base (or gate) stages 32 (CBS) having first inputs connected in parallel to output I from the gm stage and second inputs connected in parallel to common mode feedback circuit 22, and plural output switches 34 for selectively connecting one or more of common base stages 32 to an output $V_{out}$ to adjust the cutoff frequency of the filter. Output circuit 30 may also include plural capacitors 36 connected between ground and an input to one of output switches 34. In a preferred embodiment, output switches 34 are MOS switches connected in series after the capacitors, such as illustrated in FIG. 5, to thereby isolate connected common base stages 32 and capacitors 36 from those that were not connected. The number of common base stages 32 in output circuit 30 and the capacitance values of capacitors 36 may be selected to obtain the desired selectable cutoff frequencies.

Output circuit 30 may be operated conventionally by closing one or more of output switches 34 as needed to provide the appropriate cutoff frequency for the filter to which the circuit is connected. Output circuit 30 may be associated with any stage of a multistage filter, and each stage may have its own output circuit 30.

Figure 6:
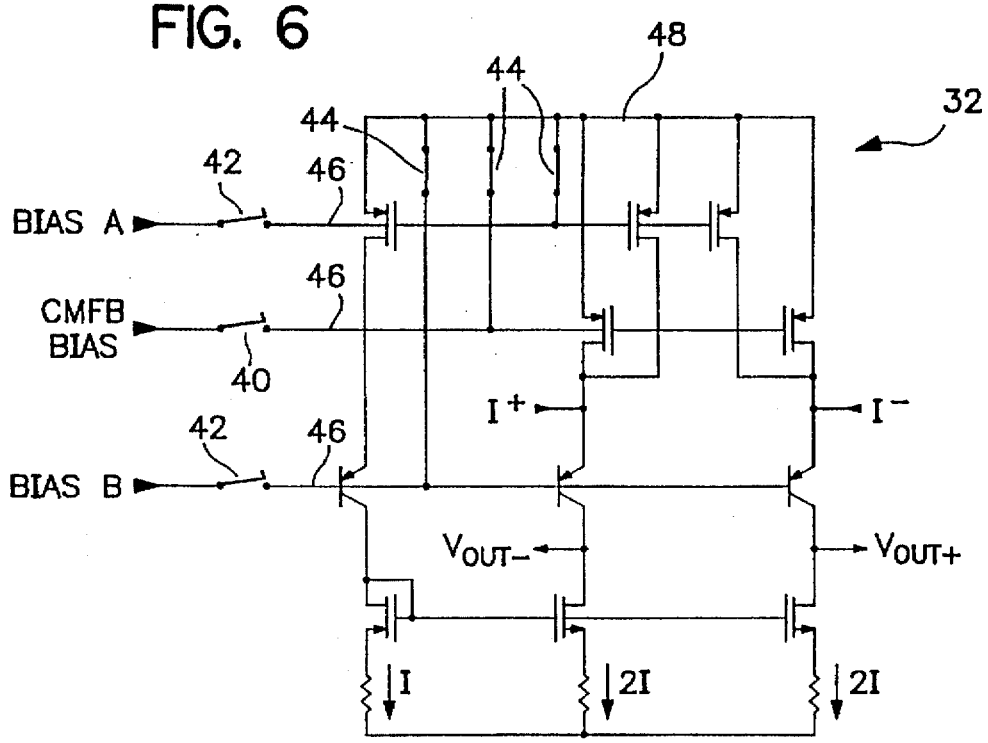
FIG. 6 is a circuit diagram of a preferred embodiment of the common base stage of the present invention.

While a conventional common base (or gate) stage may be used, in a preferred embodiment of the present invention the deselected common base stages are isolated from the selected ones of the common base stages. With reference now to FIG. 6, a preferred embodiment of common base stage 32 includes switches for selectively isolating common base stage 32 when its associated output switch 34 has not been closed. Second switch 40 may selectively isolate deselected ones of common base stages 32 from common mode feedback circuit 22. Third switches 42 may selectively isolate deselected ones of common base stages 32 from a bias from a bias generator (e.g., bandgap or other suitable generator.) Fourth switches 44 may connect to a (positive) supply rail 48 the inputs 46 to common base stage 32 that receive the bias generator and CMFB biases. Operation of switches 40, 42, and 44 powers down common base stage 32 so that a deselected stage 32 is electrically isolated from other filter circuitry.

In operation, the invention improves the output response of active filters where a programmable capacitor array has been used to obtain a desired frequency response. For example, the series switch resistance between the top plate of the capacitors and the common base circuitry is eliminated. While output switches 34 do have some series resistance as well, it is of no consequence since following stages have very high impedance. Further, where a low supply voltage is needed, the present invention allows the use of programmable selection of frequency response that was not possible with prior art capacitor arrays due to insufficient gate drive.

The present invention also will find application in various types of active filters, and the invention herein is not limited to gm-C filters. As is apparent from the figures, the invention may be used with differential and single-ended filters. Further, the illustration of specific transistors in the figures is not meant to limit the invention to the conductivity type and transistor types shown, with others being known to those of skill in the art.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A gm-C filter comprising:
    a gm stage for receiving an input signal and for providing an output signal;
    a common mode feedback circuit for providing a bias to maintain a DC component of an output voltage of said output signal from said gm stage at a reference level;
    plural common base stages, each having a first input connected to said gm stage and a second input connected to said common mode feedback circuit; and
    plural first switches, each connected to at least one of said plural common base stages for selectively connecting said at least one of said common base stages to an output of said gm-C filter to control a tuning range of the gm-C filter.

2. The filter of claim 1 wherein said each of said plural common base stages comprises switching means for selectively isolating from said common mode feedback circuit, ones of said common base stages that have not been selectively connected to the output of said gm-C filter.

3. The filter of claim 2 wherein each of said switching means comprises a further switch for connecting a bias circuit to a supply rail in said ones of said common base stages that have not been selectively connected to the output of said gm-C filter.

4. The filter of claim 3 wherein said bias circuit comprises further switching means for isolating said bias circuit from input bias signals from a bias generator, said bias circuit being isolated from said ones of said common base stages that have not been selectively connected to the output of said gm-C filter.

5. The filter of claim 1 further comprising plural capacitors, each of said capacitors being connected between ground and an input to a respective one of said plural first switches.

6. An output circuit for adjusting the cutoff frequency of an active filter which has a common mode feedback circuit for providing a bias to maintain a DC component of an output voltage at a reference level, the output circuit comprising:
    plural common base stages, each having a first input connected to a gm stage of the active filter and a second input connected to an output of the common mode feedback circuit;
    wherein each of said plural common base stages has a first switch for selectively connecting an output of the active filter to an output of the said each of said common base stages to adjust the active filter cutoff frequency; and
    wherein each said first switch has a capacitor connecting ground to an input to said first switch.

7. The circuit of claim 6 wherein each of said plural common base stages comprises a second switch for isolating a bias circuit therein from the bias from the common mode feedback circuit in ones of said common base stages that have not been selectively connected to the active filter output.

8. The circuit of claim 7 wherein each of said plural common base stages further comprises a third switch for connecting the bias circuit to a supply rail in said ones of said common base stages that have not been selectively connected.

9. The circuit of claim 6 wherein each of said plural common base stages comprises means for receiving input bias signals from a bias generator, and a fourth switch for isolating said means from the input bias signals from the bias generator in ones of said common base stages that have not been selectively connected to the active filter output.

10. The circuit of claim 9 wherein each of said plural common base stages further comprises a fifth switch for connecting said means to a supply rail in said ones of said common base stages that have not been selectively connected.

11. The circuit of claim 6 wherein the number of said plural common base stages is related to a desired number of cutoff frequencies for the filter.

12. The circuit of claim 6 wherein the active filter is a gm-C filter.

13. A method for controlling a tuning range of an active filter which has a common mode feedback circuit for providing a bias signal, the method comprising the steps of:

(a) providing plural common base stages, each having a first input connected to a stage of the active filter and a second input connected to an output from the common mode feedback circuit;

(b) providing plural capacitors, each being connected between ground and an output of a respective one of the common base stages; and (c) selectively connecting said output from each of the plural common base stages to a filter output to control the tuning range of the filter.

14. The method of claim 13 further comprising the step of isolating from the common mode feedback circuit the ones of the common base stages whose outputs are not selectively connected to the filter output.

15. The method of claim 14 further comprising the steps of providing each of the common base stages with a bias circuit, and connecting the bias circuit to a supply rail in the ones of the common base stages whose outputs are not selectively connected to the filter output.

16. The method of claim 13 further comprising the steps of providing a bias signal from a bias generator to each of the common base stages, and isolating the bias signal from the ones of the common base stages whose outputs are not selectively connected to the filter output.

17. The method of claim 13 wherein the active filter is a gm-C filter.

18. A method for adjusting a cutoff frequency of an active filter which has a common mode feedback circuit for providing a bias signal, the method comprising the steps of:

(a) providing plural common base stages, each having a first input connected to a gm stage of the active filter and a second input connected to an output of the common mode feedback circuit;

(b) for each of the common base stages, connecting a capacitor to an output therefrom; and (c) selectively isolating ones of the plural common base stages and their respective connected capacitors from the filter output to adjust the cutoff frequency of the filter.

19. The method of claim 18 further comprising the step of disconnecting the selectively isolated ones of the plural common base stages from the common mode feedback circuit bias.

20. The method of claim 19 further comprising the steps of providing a bias for the plural common base stages, and disconnecting the bias from the selectively isolated ones of the plural common base stages.

* * * * *